US011362604B2

(12) United States Patent
Marshall et al.

(10) Patent No.: US 11,362,604 B2
(45) Date of Patent: Jun. 14, 2022

(54) COMPACT, LOW-COST ELECTRIC FIELD MILL

(71) Applicant: The Regents of the University of Colorado, Denver, CO (US)

(72) Inventors: Robert A. Marshall, Boulder, CO (US); André Lucas Antunes de Sá, Lafayette, CO (US); Austin P. Sousa, Boulder, CO (US); Alec Viets, Denver, CO (US)

(73) Assignee: Regents of the University of Colorado, Denver, CO (US)

( * ) Notice: Subject to any disclaimer, the term of this patent is extended or adjusted under 35 U.S.C. 154(b) by 286 days.

(21) Appl. No.: 16/852,498

(22) Filed: Apr. 19, 2020

(65) Prior Publication Data

US 2020/0336090 A1 Oct. 22, 2020

Related U.S. Application Data

(60) Provisional application No. 62/835,817, filed on Apr. 18, 2019.

(51) Int. Cl.
*H02P 6/16* (2016.01)
*H02K 11/40* (2016.01)
*H02K 11/22* (2016.01)
*H02K 5/167* (2006.01)

(52) U.S. Cl.
CPC ............. *H02P 6/16* (2013.01); *H02K 5/1675* (2013.01); *H02K 11/22* (2016.01); *H02K 11/40* (2016.01)

(58) Field of Classification Search
CPC ........... H02P 6/16; H02K 11/22; H02K 11/40; H02K 5/1675
See application file for complete search history.

(56) References Cited

U.S. PATENT DOCUMENTS

| | | | | |
|---|---|---|---|---|
| 5,315,232 A | * | 5/1994 | Stewart | G01R 29/12 324/72 |
| 7,109,698 B2 | * | 9/2006 | Swenson | H02G 13/00 324/458 |

OTHER PUBLICATIONS

"Aircraft Measurement of Electric Field,: Self-Calibration" Journal of Geophysical Research, vol. 98, No. D4, Apr. 20, 1993, by W.P. Winn.
"A low noise, microprocessor-controlled, internally digitizing rotating-vane electric field mill for airborne platforms," Journal of Atmospheric and Oceanic Technology, Jun. 5, 2006.

* cited by examiner

*Primary Examiner* — Zoheb S Imtiaz
(74) *Attorney, Agent, or Firm* — Macheledt Bales LLP; Jennifer L. Bales

(57) ABSTRACT

An electric field mill (EFM) incorporates a novel rotor and shaft grounding mechanism providing a low-impedance path to ground via a bearing packed with electrically conductive grease. A removable bearing washer allows for servicing. The EFM includes a data processing scheme built around a peak detection algorithm and moving much of the signal processing to digital processing. A GPS disciplined sampling clock and cellular connectivity allow for use and maintenance of arrays of widely scattered EFMs.

16 Claims, 6 Drawing Sheets

COMPACT, LOW-COST ELECTRIC FIELD MILL

This invention was made with government support under grant number 1661726 awarded by the National Science Foundation. The government has certain rights in the invention.

BACKGROUND OF THE INVENTION

Field of the Invention

The present invention relates to compact, low-cost electric field mills. In particular, the present invention relates such electric field mills having reduced power requirements and increased durability.

Discussion of Related Art

An Electric Field Mill (EFM) measures the local, ambient in-situ electric field. The electric field near the Earth's surface is typically around 100 V/m in the absence of weather, and can increase to a few kV/m when electrified storms pass overhead. Measurements of the local electric field can therefore be used to study lightning and thunderstorm electrification; for asset protection and safety concerns at airports, golf courses, and radio transmission facilities; and at any location where knowledge of changing electric fields is desired. An array of independent electric field mills can be used in conjunction with other lightning measurement systems to better understand charge movement within thunderclouds, and to better predict lightning storm trends in the future.

FIG. 1 (prior art) shows an example of a conventional EFM. The EFM operates by moving a grounded rotor shield plate 1 over electrode sense plates 2, alternately exposing the sense plates to the electric field and then shielding them. This alternation can be continuous, using a grounded spinning rotor, or through back-and-forth actuation. Baseplate 3 is grounded. Motor 5 spins rotor 1. Amplifier 6 provides the signal from sensor plates 2 to multiplier circuit 7, attached to rotary encoder 4. Demodulator 8 extracts the amplitude signal, which forms the electric field measurement provided to Display 9.

When the sense plates are exposed to the electric field, they collect free electrons according to:

$$q(t) = \varepsilon_0 E A(t) \tag{1}$$

where q(t) is the time-varying charge accumulation, E is the background electric field, A(t) is the time-varying exposed area of the plates, and $\varepsilon_0$ is the permittivity of free space. For a continuous, uniformly spinning rotor, A(t) can be described by a sinusoid as the electrodes are shielded and exposed. Equation 1 then becomes:

$$q(t) = \varepsilon_0 E A_0 \sin(3\omega t) \tag{2}$$

where $A_0$ is the nominal area of the set of plates, and $\omega$ is the angular velocity of the rotor as it spins over the electrodes. The factor of three comes from the fact that (in our design) there are two groups of three parallel-connected plates, and therefore the plates are alternately exposed and shielded three times for every rotation of the motor. Other designs use two or four sets of sense plates, which would modify the equation accordingly. The accumulated charge is measured using a charge amplifier circuit.

The ambient electric field, E, assumed to be changing at a rate slower than the rotation of the field mill, is directly proportional to the amplitude of the measured sine wave. The induced currents are measured with an appropriately-designed analog and digital electronics system.

Current EFMs work well, but have several disadvantages in terms of durability and convenience in use. One weakness is in the grounding systems used. The rotor and shaft must be kept grounded to prevent bulk charge accumulation, which may introduce erroneous drifts and offsets into the measured signal. Refer again to FIG. 1. Existing EFMs generally use one of two mechanisms to ground the rotor: 1) a direct electrical connection, requiring the rotor to be oscillated back and forth rather than spinning, which provides a maintenance-free ground at the expense of high-frequency operation, or 2) a frictional, sliding contact in the form of carbon slugs, carbon brushes, slip rings, or sliding metal contacts. Frictional sliding contacts allow for high-speed rotation but require periodic maintenance to replace contacts due to wear, reducing the length of time in which the EFM can operate unattended. Additionally, frictional sliding contacts impart higher mechanical resistance to the rotor, thereby increasing power consumption.

In addition to rotation speed restrictions, current systems demodulate the measured signal using an analog low pass filter, which may reduce the detectable electric field frequency to 1 Hz or lower.

Another disadvantage of the system of FIG. 1 is that demodulation/amplitude extraction 8 is performed by analog circuitry (e.g. with a low pass filter). This requires more power and additional analog circuitry than if demodulation is performed in digital circuitry.

A need remains in the art for more durable, lower power EFMs.

SUMMARY OF THE INVENTION

It is an object of the present invention to provide more durable, lower power EFMs.

An important feature of the present invention is reduced power requirements. The low-power design (4 W for continuous operation) is a combination of power saving implementations on both mechanical hardware and signal processing. On the mechanical side, the conductive grease solution used for grounding the spinning shaft provides minimal friction when compared to a brush grounding mechanism, thus wasting little power to maintain a grounded connection. Similarly, an electronically commutated (EC) motor is used in the EFM, ensuring the highest possible efficiency and durability. Finally, the analog front-end is made to be simple and have few components to minimize its power usage, by offloading most of the signal processing to the onboard computer, where extra CPU cycles are not a significant source of power consumption.

The present invention incorporates a novel shaft grounding mechanism, which allows for longer operational time between servicing, and allows for faster shaft rotation while simultaneously reducing power consumption induced by frictional sliding mechanisms. Faster shaft rotation in turn allows the EFM to measure higher-frequency changes in the electric field. The conductive-greased bearing grounding mechanism provides substantially longer operational time than sliding metal contacts, and introduces substantially less mechanical resistance than a carbon brush, allowing for longer run times with lower power consumption.

As another feature, EFMs according to the present invention incorporate a novel data processing scheme built around a peak detection algorithm, which eliminates the need for a conventional demodulating circuit, and allows the EFM to capture field changes nearing the rotation frequency, rather than requiring an integration period of tens to hundreds of rotations.

The EFM preferably samples data using a GPS-disciplined sampling clock, which allows for sample-accurate comparison of data over a distributed array of EFMs and is essential for phased-array and tomographic science.

Finally, EFMs according to the present invention allow remote wireless connection via cellular modem or a local wireless network, which aids in the successful operation of a distributed EFM array. Each EFM can be remotely activated or deactivated; system gain can be remotely set; housekeeping signals such as temperature, power consumption, and data storage capacity can be transmitted; and data can be downloaded on command.

An embodiment of the present invention includes three structural plates: the lid, the top plate, and the bottom plate, separated by aluminum standoffs. The limited analog electronics are placed in the lower chamber between the top plate and the bottom plate. The digital electronics and motor are located in the upper chamber, between the lid and the top plate.

An insulated holder for the sense plates is placed along the underside of the bottom plate, insulating the electrodes from the grounded aluminum frame. In one embodiment, the electrodes consist of six machined aluminum wedges, which rest in an electrically-insulating retainer. Each electrode is connected to the analog electronics by a conductive bolt and locking nut. Bolts are chosen to be electrically conductive and non-corroding in an outdoor environment. The rotor is a two-piece design. The rotor blades are machined from a flat aluminum plate, which is bolted onto a cylindrical machined shoulder. The shoulder is then press-fit onto an aluminum or steel shaft. The rotor and shaft are kept grounded to prevent bulk charge accumulation, which may introduce erroneous drifts and offsets into the measured signal.

A low-impedance path to ground is provided through a main support bearing packed with an electrically conductive carbon grease and pressed into the lower aluminum support plate. A neoprene washer is pressed in above the bearing, to prevent contamination of the grease while allowing for easy servicing.

The analog circuitry provides amplification and the digital circuitry contains a microcontroller, a power supply, and peripherals, such as a GPS (for time-tagging data) and cellular modem (for communication). The signal from the optical encoder is directly sampled and recorded by an ADC. The signal is thresholded and quantized to one bit. Another ADC samples the conditioned analog signal from the electrodes.

An EFM for measuring an electric field includes fixed sensor plates configured to sense the electric field via accumulated charge on the sensor plates, a conductive rotor attached to a conductive rotating shaft, the rotor having spaced-apart blades configured to alternately block and unblock sets of the sensor plates from sensing the electric field, a conductive grounded housing, an isolation plate for containing the sensor plates and electrically isolating the sensor plates from the shaft and rotor, a detector for sensing the rotation of the shaft, analog circuitry attached to the sensor plates and the detector, the analog circuitry configured to amplify the sensed accumulated charge to form an accumulated charge signal, and signal processing circuitry attached to the analog circuitry configured to generate an electric field measurement based upon the amplified accumulated charge signal and the sensed rotation. The rotor and the shaft are grounded by a bearing attached to the housing and packed with electrically conductive grease configured to allow the shaft to rotate.

The bearing may include a removable washer configured to allow the grease to be replenished. The grease might be conductive carbon grease.

In preferred embodiments, the signal processing circuitry is digital and is configured to convert the amplified accumulated charge signal into a digital charge signal, convert the sensed rotation into a digital rotation signal, combine the digital charge signal and the digital rotation signal in order to compute signal polarity, extract amplitude from the digital charge signal, and generate the electric field measurement based on the extracted amplitude and the signal polarity.

A GPS receiver may provide time-tagging of the electric field measurement and cellular communication equipment may be provided to communicate with a remote station. This communication allows monitoring of the EFM (for example via temperatures sensors at the analog circuitry and the digital circuitry), and may also allow remote commands to the digital circuitry, such as restart and motor speed commands.

The present invention is particularly useful in forming arrays of such EFMs. The remote station collects data from each EFM via the cellular communication equipment and synchronizes the data based on the GPS receiver time-tagging.

As a feature, the EFM uses an electronically commutated motor configured to rotate the shaft and the rotor, such as a three-phase motor. The digital circuitry has a dedicated motor controller integrated circuit configured to control the motor in order to maintain shaft rotation speed. As above, the remote station can adjust the motor speed.

The digital circuitry may extract amplitude using a Hilbert Transform or a spline-based envelope extraction. Generally, the digital circuitry applies a calibration map and site correction to the electric field measurement.

DETAILED DESCRIPTION OF THE INVENTION

TABLE 1

| | |
|---|---|
| 100 | EFM |
| 101 | Housing |
| 102 | Lid |
| 104 | Top plate |
| 106 | Bottom plate |

TABLE 1-continued

| | |
|---|---|
| 107 | Rotor blades |
| 108 | Rotor |
| 109 | Rotor shoulder |
| 110 | Shaft |
| 112 | Electrodes - sensor plates |
| 114 | Insulating isolation plate |
| 115 | Bearing retainer |
| 116 | Bearing |
| 120 | Digital PCB |
| 122 | Shaft optoencoder |
| 124 | Analog PCB |
| 126 | Motor |
| 128 | Motor mount |
| 130 | Optocoupler |
| 132 | Shaft coupler |
| 134 | O-ring groove |
| 136 | Aluminum standoffs |
| 138 | Insulating support ring |
| 140 | Neoprene bearing washer |
| 142 | Nylon spacers |
| 144 | Conductive bolts |
| 146 | Bolts |
| 148 | Nuts |
| 156 | Conductive grease |
| 200 | Electrical system |
| 202 | Processor |
| 204 | Power regulation |
| 208 | Temp sensor |
| 209 | Motor driver |
| 210 | Modem |
| 211 | GPS |
| 220 | Optoencoder ADC |
| 222 | Field ADC |
| 230 | Power supply |
| 234 | Temp sensor |
| 235 | Analog signal chain |
| 302 | Preamp |
| 304 | VGA |
| 306 | Antialiasing filter |
| 308 | Storage |
| 310 | Amplitude extraction |
| 312 | Polarity computation |
| 314 | Electric field |
| 316 | Calibration map |

Table 1 shows elements of the present invention and associate reference numbers.

Figure 2A:
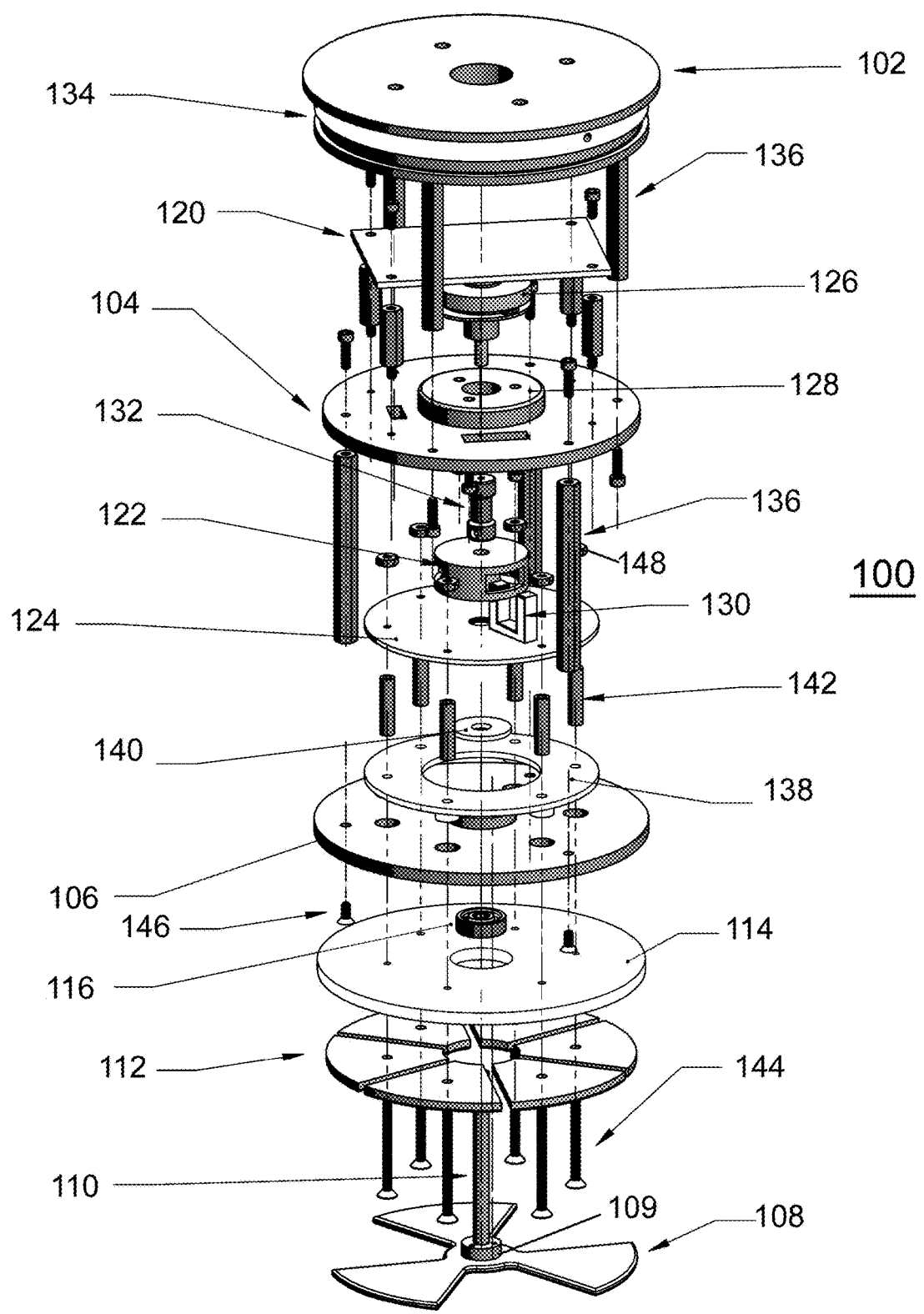
FIG. 2A is a side exploded isometric diagram of the present invention.
Figure 2C:
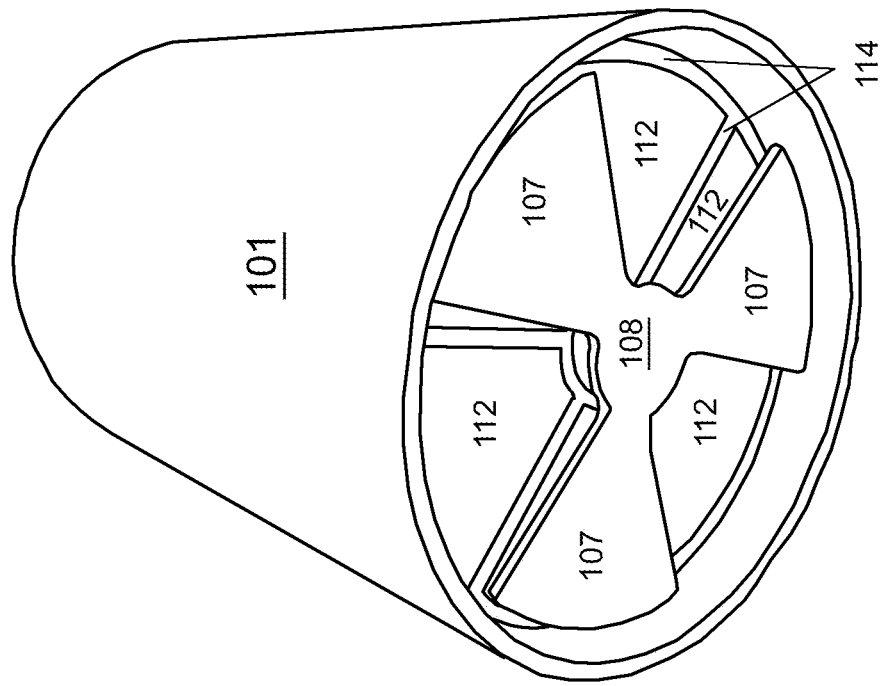
FIG. 2C is a bottom isometric view of the present invention with its housing in place.
Figure 2B:
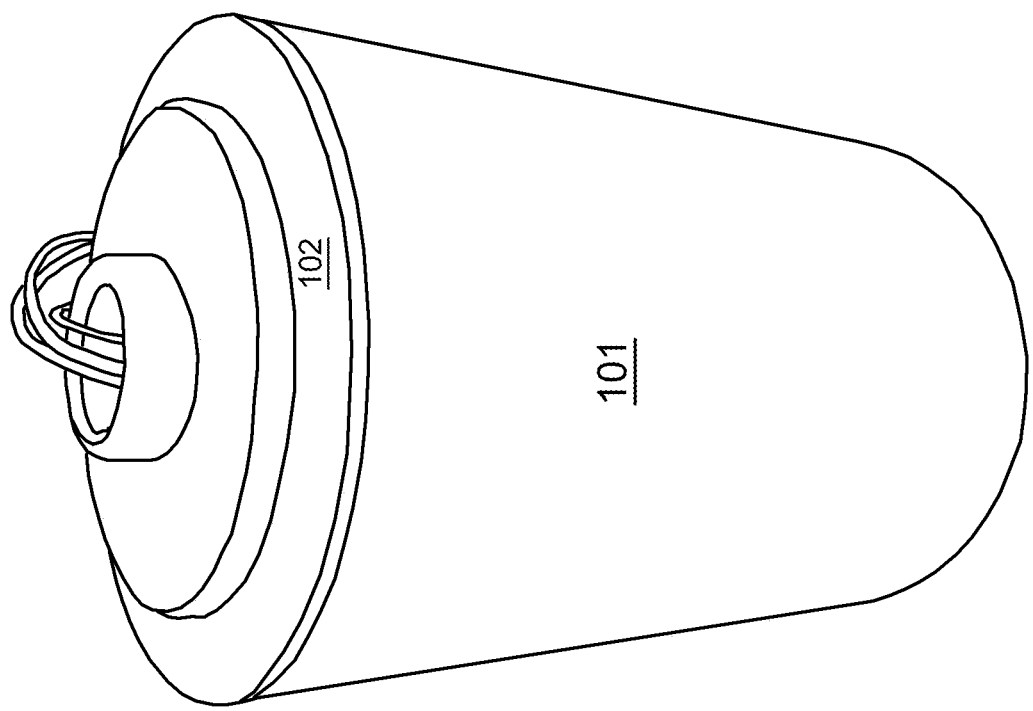
FIG. 2B is a side isometric view of the present invention with its housing in place.
Figure 3:
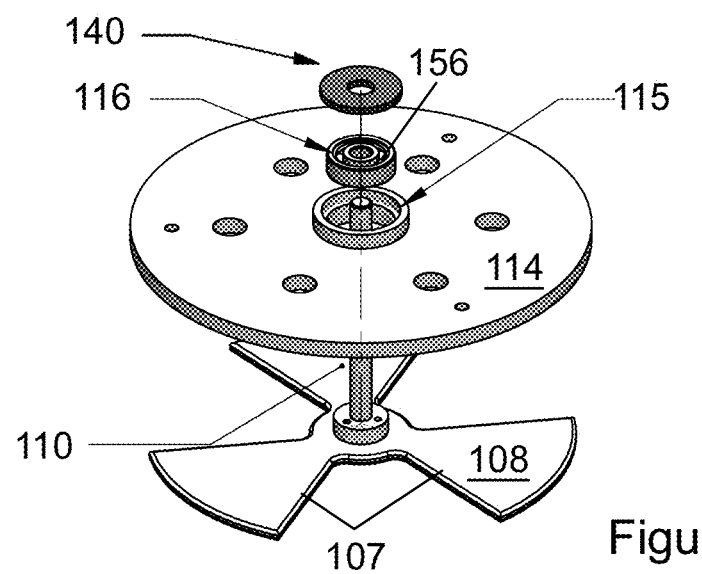
FIG. 3 is an isometric diagram illustrating the grounding system of the embodiment of FIG. 2.
Figure 4:
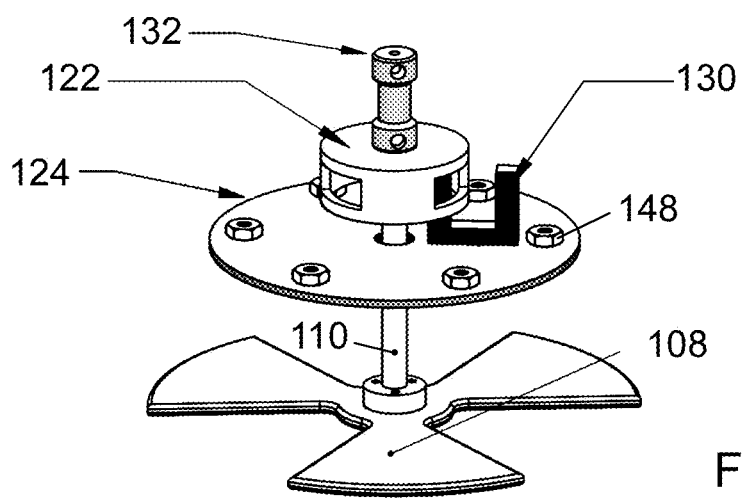
FIG. 4 is an isometric diagram illustrating the optical encoder system of the embodiment of FIG. 2.
Figure 5:
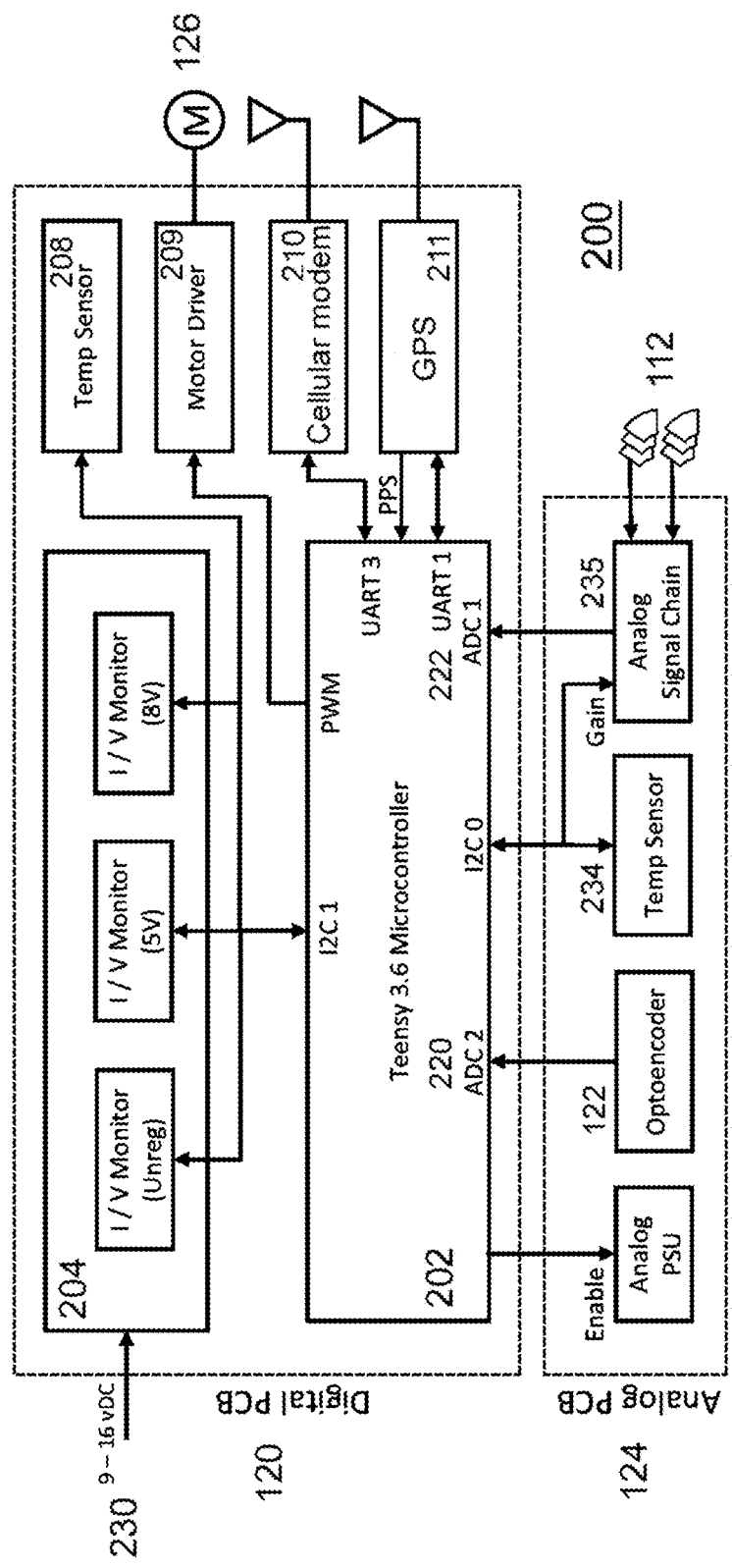
FIG. 5 is a block diagram illustrating EFM electrical systems according to the present invention.
Figure 6:
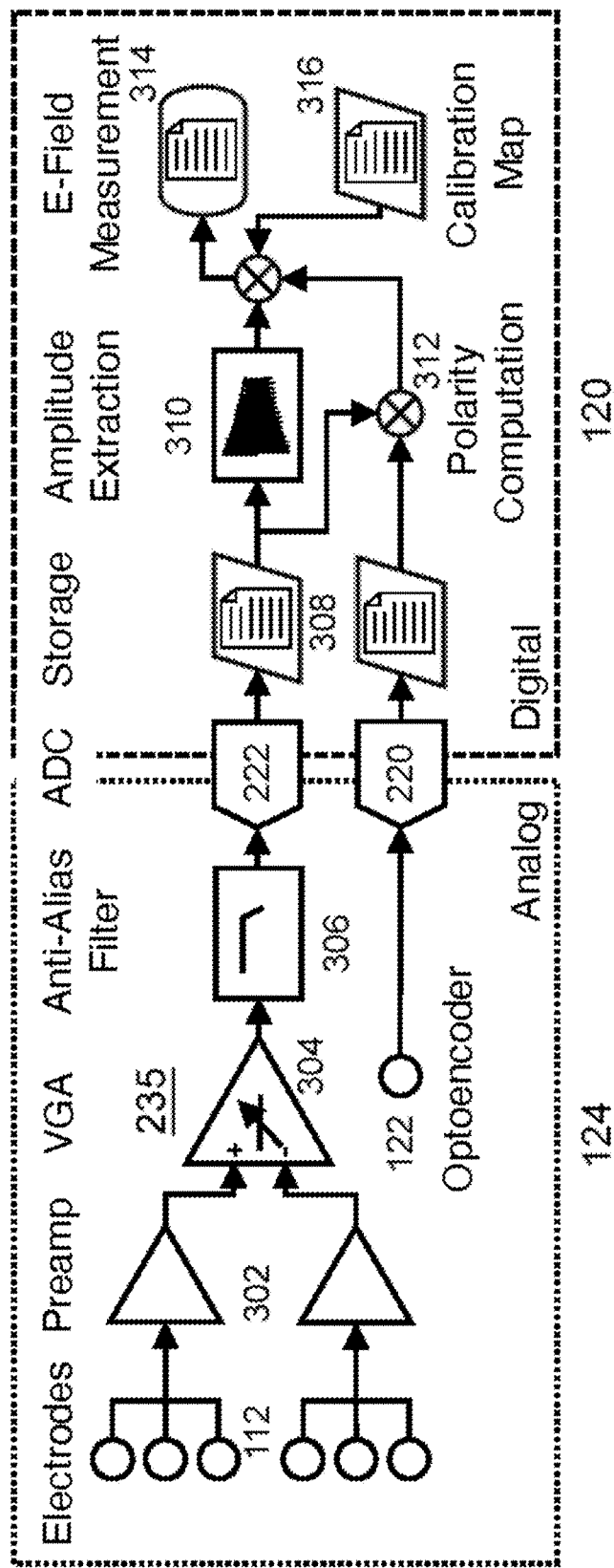
FIG. 6 is a flow diagram illustrating signal processing performed according to the present invention.

FIG. 2A is an isometric exploded diagram of EFM 100. FIG. 2B is a side isometric view of EFM 100 with housing 101 in place. FIG. 2C is a bottom isometric view of EFM 100 with housing 101 in place. FIG. 3 shows the grounding system in more detail. FIG. 4 shows the optical encoding. FIG. 5 Illustrates the electrical system. FIG. 6 shows how signal processing is accomplished. EFM 100 addresses several shortcomings of existing field mill designs, which allow EFM 100 to measure higher-frequency electric field signals, while using lower power, and operating for longer periods (weeks to months) between servicing.

EFM 100 consists of several machined aluminum components, and makes use of off-the-shelf hardware wherever possible. Several of the components can be manufactured using consumer-grade 3D printers. ABS or similar filament material is required for strength across a wide range of temperatures.

FIG. 2A shows a blown-up view of the mechanical system of EFM 100, with housing 101 removed. FIG. 2B is a side isometric view of EFM 100 with housing 101 in place. FIG. 2C is a bottom isometric view of EFM 100 with housing 101 in place. The assembly comprises housing 101 enclosing and attached to three structural plates—the lid 102, the top plate 104, and the bottom plate 106—separated by standard aluminum standoffs 136.

A 3D-printed (ABS) holder 114 for the sense plates 112 is placed along the underside of bottom plate 106, insulating electrodes 112 from the grounded aluminum frame. Analog electronics are placed on a custom printed circuit board (PCB) 124 in the lower chamber, while the digital electronics and motor 126 are located on a second PCB 120 in the upper chamber.

The assembly is located within a 6" long, 4.5" diameter aluminum cylinder housing 101, which provides weather protection and electromagnetic shielding.

Refer to the bottom portion of FIG. 2A and FIG. 2C. The electrodes 112 consist of six machined aluminum wedges, which rest in an electrically-insulating retainer 114, 3D printed using ABS. Each electrode is connected to the analog PCB 124 by a conductive bolt 144 and locking nut 148. It is important that a solid electrical connection is made; bolts 144 should be chosen to be electrically conductive and non-corroding in an outdoor environment.

The rotor 108 is a two-piece design. Rotor blades 107 are machined from a flat aluminum plate, which is bolted onto a cylindrical machined shoulder 109. The shoulder is then press-fit onto an aluminum or steel shaft 110. This design simplifies machining of the rotor blades and provides excellent perpendicular alignment with the shaft.

FIG. 3 is an isometric diagram illustrating the grounding system of EFM 100. The rotor 108 and shaft 110 are kept grounded to prevent bulk charge accumulation, which may introduce erroneous drifts and offsets into the measured signal.

EFM 100 provides a low-impedance path to ground through a main support bearing 116 which is electrically connected to housing 101. This bearing, a single-shielded NSK 625-Z, was selected through empirical investigation of deep-groove 625 bearings from several manufacturers. The NSK product is available without grease or preservative wax, and provides a reasonably-consistent 1~kΩ path between the rotating bearing 116 and static ring 115 directly from the manufacturer. The bearing is then packed with an electrically conductive carbon grease 156 (MG Chemicals MG-846), which lowers the impedance to under 10Ω along a full revolution of the bearing. The bearing is then pressed into the lower aluminum support plate 114 retainer 115; a neoprene washer 154 is pressed in above, to prevent contamination of grease 156 while allowing for easy servicing.

The conductivity of this mechanism will decrease over time, which may introduce system noise, as well as decrease the maximum measurable electric field frequency. However, the system can be easily serviced by adding fresh carbon grease 156. The design allows for serviceability by lifting up the neoprene protective washer 154, and injecting fresh grease by means of a syringe, screwdriver, or similar tool. Experimentation suggests that additional grease restores the grounding mechanism to its original continuity.

FIG. 4 is an isometric diagram illustrating the optical encoder system 122, 130, 132 of EFM 100. Consistent, accurate rotational speed is fundamental to accurately measuring the electric field. The EFM uses a 3-phase motor 126 (Maxxon EC32, part no. 339624) and a dedicated motor controller integrated circuit 120 to spin shaft 110 and grounded rotor 108. The rotational speed and phase (e.g., which set of sense plates 112 is covered) are measured using an optocoupler 130, encoded by optical encoder apparatus 122 and transmitted to the analog circuitry via shaft coupler 132. The rotational speed is actively managed in software using a PID controller 202 (see FIG. 5). The shaft encoder ring 122 is shimmed or press-fitted onto shaft 110. The open and closed sections of the shaft encoder are aligned with the rotor blades 107, to properly resolve the polarity of the measured electric field. Ideally shaft encoder 122 should be machined out of aluminum for durability, but may be 3D-printed using ABS or another high-temperature material and a 100% material fill.

FIG. 5 is a block diagram illustrating the EFM 100 electrical system 200 according to the present invention. The EFM electrical system consists of two PCBs: 1) an analog board 124 containing signal amplification circuitry, and 2) a digital board 120, containing a microcontroller 202, power regulation 204, and peripherals 208-211. EFM 100 features a Teensy 3.6 microcontroller daughterboard 202 for primary system control, an Adafruit Ultimate GPS module 211 for clock synchronization, and an Adafruit FONA 800 2G cellular modem 210 for remote control and data retrieval.

The Teensy 3.6 platform 202 is set up to use two of its programmable delay block (PDB) channels for triggering the sampling of two independent 16-bit ADCs 220, 222. The first ADC 222 samples the conditioned analog signal from the electrodes 112, which will be later processed into electric field amplitude measurements, while the second ADC 220 samples the optical encoder 122 of the rotor shaft 110 for use in motor speed control and polarity information of the electric field. In a preferred embodiment, the PDB channels are programmed to initiate an ADC conversion at the data sampling frequency of 1 kHz, but an ADC conversion actually consists of 32 samples of the analog signal that are averaged together. There is a delay of one CPU clock cycle for the PDB channel associated with the second ADC 220 to ensure that the first ADC 222 is consistently ahead of the second ADC.

Electrode 112 signals are provided to analog signal chain 235, which is converted to a digital signal for processing by ADC 222 (see FIG. 6).

A feature of EFM 100 is that the signal from the optical encoder 122 is directly sampled and recorded by ADC 220 on the Teensy microcontroller 202. Because the signal is binary (i.e., either higher or low), the optical encoder signal is thresholded and resampled to 1 bit to save data volume. The end result is a 1-bit signal (i.e. ones and zeros) at 1000 samples per second. This digital signal can then be aligned with the electric field signal for post processing.

The instrument operates from a nominal 12-volt DC external supply 230, which can be provided from a battery, solar power system, or an AC power adapter. The system is designed to accommodate supplies 230 between 9 and 16 volts. Provisions are included to protect against overcurrent and overvoltage situations, such as those induced by nearby lightning strikes.

Internally, the system operates on three different voltage rails: a +8V supply, which drives the motor 126 via motor driver 209; a +5V supply, which powers the digital systems and sensors; and a bipolar ±5V supply for the analog circuitry. The analog ±5V supply can be enabled or disabled in software, allowing for a low-power "standby" mode when not recording data.

Inline current and voltage measurements are taken at the input power line 230, +8V supply, and +5V supply, which are used by the microcontroller to provide state-of-health data and assist in fault diagnosis.

Additionally, an I2C temperature sensor 208 is located the digital board 120 as well as another 234 on analog board 124; temperature measurements are included in the state-of-health data.

A useful feature of the present invention is time tagging via GPS 211. Accurate time-tagging is especially critical for assimilating data from an electric field mill array. This requirement is fulfilled in EFM 100 with use of a GPS receiver and the phase-locking of the ADC sampling rate to the GPS 1 pulse-per-second signal.

Time-tagging of the data is achieved by reading the date-time information output from the Adafruit Ultimate GPS module through a UART line. The internal clock for the CPU 202, responsible for placing the ADC conversions in their appropriate 1 ms bin, is synchronized in software with the GPS 1 PPS signal, ensuring that the clock error is at most one ADC sample period. With an internal 16 MHz crystal oscillator error of 20 parts per million, the ADC conversion could drift one ADC sample period after every 50 seconds without the GPS synchronization.

Another useful feature is communication via modem 210. In order to reduce operation costs, which can scale prohibitively with the array size, the EFM is designed for long-term (months) autonomous operation. As with any autonomous system however, down-times are a possibility and the operator is tasked with monitoring the deployed systems. The EFM incorporates remote status and data logging to an online server through TCP/IP beacons, minimizing the operation costs of monitoring the EFMs, especially when the deployed field mills are hundreds of kilometers apart. The EFMs can additionally be remotely activated or deactivated, and the analog signal gain remotely set, which allows for an array to be remotely configured for periods of high or low electrical activity.

A cellular modem 800 is used in the EFM for remote communications. The mode of communication is a TCP/IP beacon that sends out regular housekeeping data from the EFM, as well as downsampled data, to an online server hosted by the EFM operator.

FIG. 6 is a flow diagram illustrating signal processing performed according to the present invention. The signal processing flow diagram summarizes the conversion of information starting from the charge accumulated at the instrument's electrodes 112 to the final electric field measurement.

Currents induced on both sets of electrodes 112 are amplified via independent transimpedance amplifiers 302, and capacitively coupled to a differential input, variable gain amplifier (VGA) 304, which provides level shifting and software-adjustable gain. The output is then low-pass filtered 306 to reduce aliasing. The signal is digitized at 16-bit resolution and 1000 samples per second using ADC 222 onboard the Teensy 3.6 microcontroller 202.

Figure 1:
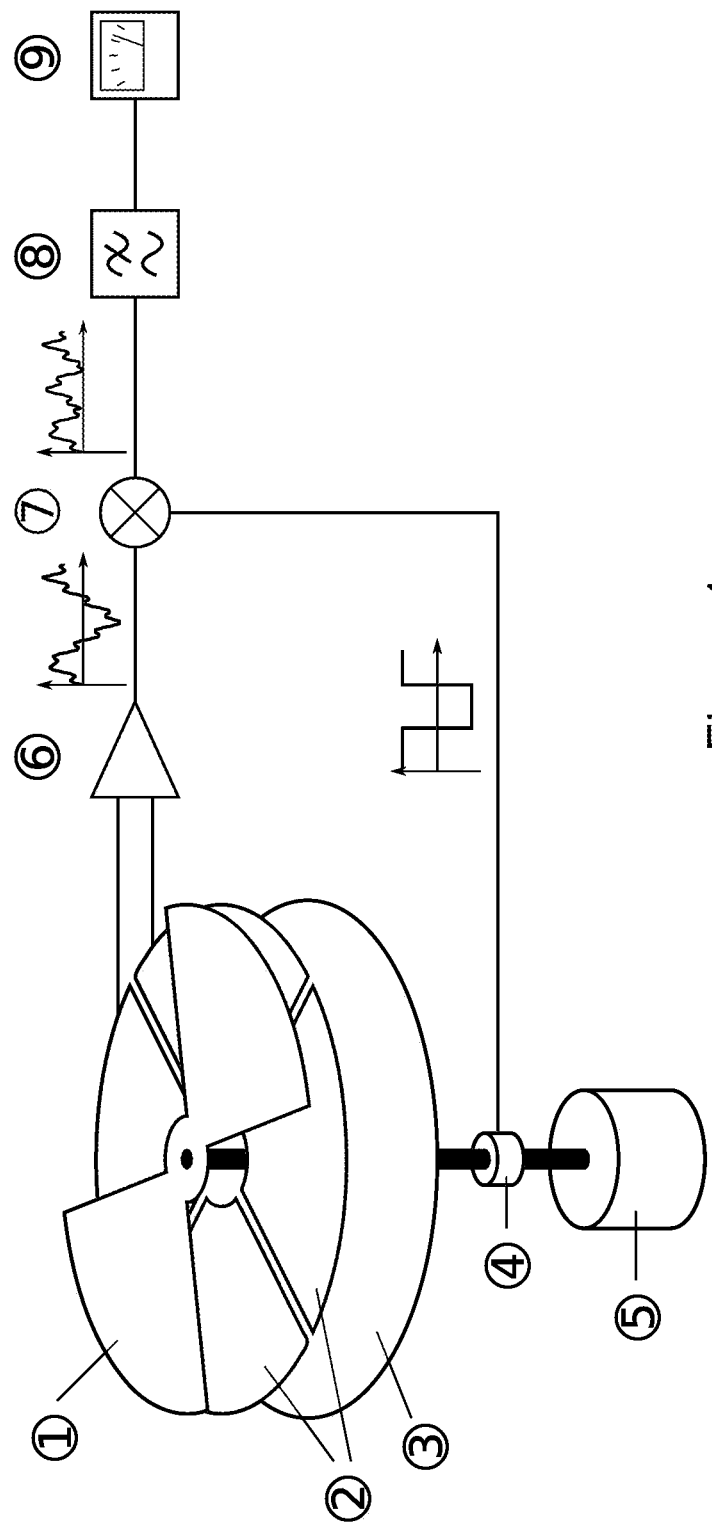
FIG. 1 (Prior Art) is a schematic block diagram of a convention EFM.

On the digital side, the stored 308 electrode signal is converted into an electric field measurement by the use of three main processes: electric field amplitude extraction 310, polarity computation 312, and application of a calibration map 314. Having amplitude extraction 310 performed on the digital side saves energy and reduces analog circuitry over systems like the one shown in FIG. 1 (prior art). Digital circuitry will be required anyway, so it makes sense to move this process.

The analog front-end is simple, performing amplification of the signal and applying an anti-alias filter prior to sampling. The sampled data from both the electrodes 112 and optoencoder 122 are saved in a raw format locally. Post-processing of the data can be performed on the instrument in near-real-time or on a conventional computer, and it requires three main sub-processes:

The extraction of the electric field magnitude from the raw data, which can be performed using a Hilbert Transform or spline-based envelope extraction;
   Computation of the electric field polarity, which is found using a binary phase detector; and Application of a calibration map and site correction to the uncalibrated electric field measurement.

Most of the EFM signal processing is performed digitally, with the EFM digitizing the measurement signal early in the processing chain. This design has three major advantages over the use of analog signal processing: (1) it minimizes the analog front-end of the instrument, which translates to cost and power savings; (2) provides greater accuracy of the electric field solution, as analog signal processing is more susceptible to noise; and (3) flexibility in the design, allowing for easy implementation updates in software EFM 100 was designed for cost-effective long-term deployment in an array configuration, combining ease of deployment and maintenance. The major components contributing to this feature include a low-power design, GPS synchronized time-tagging, and remote connectivity for status and data reporting through a cellular network. EFM 100 includes various cost saving features. In an existing version, electrical components were chosen to be hand-solderable using a quality iron or air tool. However, for rapid production an automated solder paste applicator and oven are desirable. Both circuit boards are two-layer designs, to reduce PCB manufacturing costs. The plastic insulating components are 3D-printed using ABS or other high-temperature filament. Note that hobby-grade PLA, a standard material in 3D printing, is not robust enough to temperature variation to withstand the outdoor environment. The highest cost was incurred in manufacturing the aluminum components; however the aluminum structural plates 104, 106, and 134 are designed to be manufactured from aluminum bar stock, with minimum milling required.

While the exemplary preferred embodiments of the present invention are described herein with particularity, those skilled in the art will appreciate various changes, additions, and applications other than those specifically mentioned, which are within the spirit of this invention. For example, those skilled in the art of circuit design will appreciate that the components shown in FIGS. 5 and 6 can be changed while still performing the same functions. Or the packaging might be changed such that the electronics are packaged apart from the sensor platform.

What is claimed is:

1. An electric field mill (EFM) for measuring an electric field comprising:
    fixed sensor plates configured to sense the electric field via accumulated charge on the sensor plates;
    a conductive rotor attached to a conductive rotating shaft, the rotor having spaced-apart blades configured to alternately block and unblock sets of the sensor plates from sensing the electric field;
    conductive grounded housing;
    an isolation plate for containing the sensor plates and electrically isolating the sensor plates from the shaft and rotor;
    a detector for sensing the rotation of the shaft;
    analog circuitry attached to the sensor plates and the detector, the analog circuitry configured to amplify the sensed accumulated charge to form an accumulated charge signal, and
    signal processing circuitry attached to the analog circuitry configured to generate an electric field measurement based upon the amplified accumulated charge signal and the sensed rotation;
    wherein the rotor and the shaft are grounded by a bearing attached to the housing and packed with electrically conductive grease configured to allow the shaft to rotate; and
    wherein the signal processing circuitry is digital and is configured to
        convert the amplified accumulated charge signal into a digital charge signal,
        convert the sensed rotation into a digital rotation signal,
        combine the digital charge signal and the digital rotation signal and compute signal polarity,
        extract amplitude from the digital charge signal, and
        generate the electric field measurement based on the extracted amplitude and the signal polarity.

2. The EFM of claim 1 further comprising a GPS receiver which provides time-tagging of the electric field measurement.

3. The EFM of claim 2 further comprising cellular communication equipment.

4. The EFM of claim 3, further comprising equipment configured to provide remote commands to the digital circuitry.

5. The EFM of claim 4 wherein the commands include restart and motor speed commands.

6. Multiple spaced-apart EMS according to claim 3 forming an array and further comprising apparatus for collecting data from each EFM via the cellular communication equipment and synchronizing the data based on the GPS receiver time-tagging.

7. The EFM of claim 6, further comprising equipment configured to provide remote commands to the digital circuitry.

8. The EFM of claim 7 wherein the commands include restart and motor speed commands.

9. The EFM of claim 1 further comprising an electronically commutated motor configured to rotate the shaft and the rotor.

10. The EFM of claim 9 wherein the digital circuitry further comprises a dedicated motor controller integrated circuit configured to control the motor in order to maintain shaft rotation speed.

11. The EFM of claim 1 wherein the digital circuitry is further configured to extract amplitude using a Hilbert Transform.

12. The EFM of claim 1 wherein the digital circuitry is further configured to extract amplitude using a spline-based envelope extraction.

13. The EFM of claim 1 wherein the digital circuitry is further configured to apply a calibration map and site correction to the electric field measurement.

14. The EFM of claim 1 wherein the bearing includes a removable washer configured to allow the grease to be replenished.

15. The EFM of claim 14 wherein the grease comprises conductive carbon grease.

16. The EFM of claim 1 further comprising temperature sensors configured to sense temperature at the analog circuitry and at the digital circuitry.

* * * * *